(12) United States Patent
Nishihori

(10) Patent No.: US 8,674,357 B2
(45) Date of Patent: Mar. 18, 2014

(54) METHOD FOR MEASURING IMPURITY CONCENTRATION PROFILE, WAFER USED FOR SAME, AND METHOD FOR MANUFACTURING SEMICONDUCTOR DEVICE USING SAME

(71) Applicant: Kabushiki Kaisha Toshiba, Tokyo (JP)

(72) Inventor: Kazuya Nishihori, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/775,048

(22) Filed: Feb. 22, 2013

(65) Prior Publication Data

US 2013/0161617 A1 Jun. 27, 2013

Related U.S. Application Data

(62) Division of application No. 13/224,219, filed on Sep. 1, 2011, now abandoned.

(30) Foreign Application Priority Data

Dec. 3, 2010 (JP) ................................. 2010-270218

(51) Int. Cl.
*H01L 23/58* (2006.01)
*H01L 29/10* (2006.01)

(52) U.S. Cl.
USPC ............... 257/48; 257/E21.521; 257/E21.529

(58) Field of Classification Search
USPC .............................. 257/E21.521, E21.529, 48
See application file for complete search history.

(56) References Cited

U.S. PATENT DOCUMENTS

| 6,890,825 | B2 | 5/2005 | Ross et al. |
| 6,899,772 | B1 | 5/2005 | Morando |
| 7,247,924 | B2 * | 7/2007 | Geiss et al. ................... 257/565 |
| 7,504,838 | B1 | 3/2009 | Zhao et al. |

FOREIGN PATENT DOCUMENTS

| JP | 08136482 A | 5/1996 |
| WO | 2005116304 A2 | 12/2005 |

* cited by examiner

*Primary Examiner* — Asok K Sarkar
(74) *Attorney, Agent, or Firm* — Patterson & Sheridan, LLP

(57) ABSTRACT

According to an embodiment, a method for measuring an impurity concentration profile uses a wafer including a semiconductor layer. The method includes measuring an impurity concentration profile in a depth direction from each surface of a plurality of first portions, each of the first portions being included in any one of a plurality of first regions provided in the semiconductor layer. Each of the first regions has a different size and is surrounded by a second region including a second portion having a different structure from the first portion. The method includes determining a change between the impurity concentration profiles measured in the first regions.

8 Claims, 5 Drawing Sheets

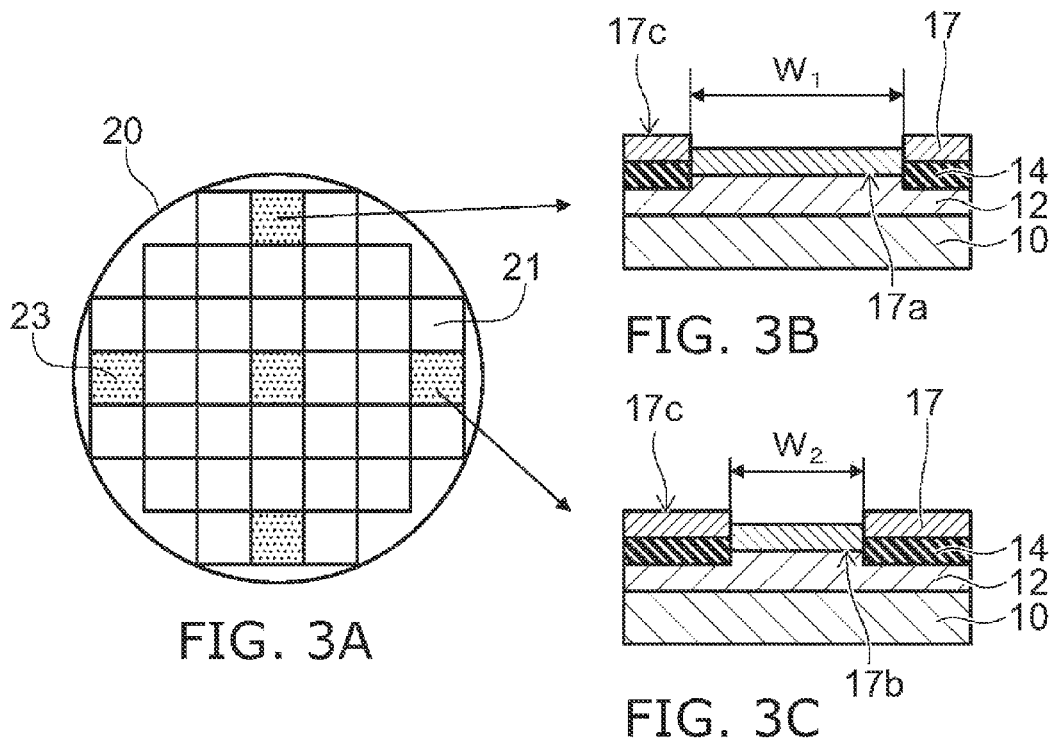
FIG. 3A
FIG. 3B
FIG. 3C
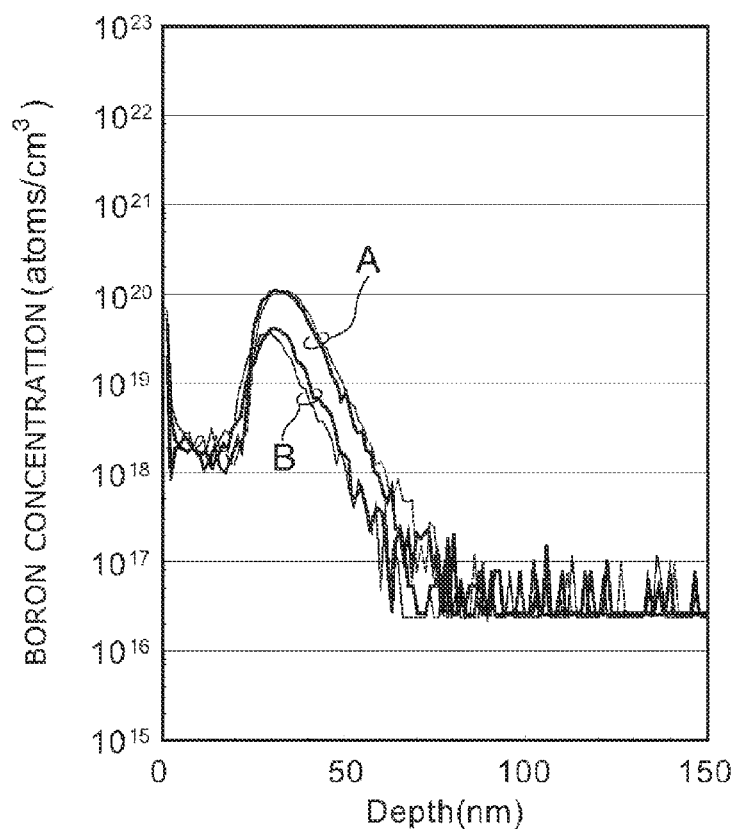
FIG. 4

US 8,674,357 B2

METHOD FOR MEASURING IMPURITY CONCENTRATION PROFILE, WAFER USED FOR SAME, AND METHOD FOR MANUFACTURING SEMICONDUCTOR DEVICE USING SAME

CROSS-REFERENCE TO RELATED APPLICATIONS

This application is a divisional of U.S. patent application Ser. No. 13/224,219, filed on Sep. 1, 2011, which is based upon and claims the benefit of priority from Japanese Patent Application No. 2010-270218, filed on Dec. 3, 2010; the entire contents of which are incorporated herein by reference.

FIELD

Embodiments are generally related to a method for measuring an impurity concentration profile, a wafer used for the same, and a method for manufacturing a semiconductor device using the same.

BACKGROUND

Measuring impurity concentrations accurately is very important in the development and manufacture of semiconductor devices. As an example, a bipolar junction transistor (BJT) is used for amplifiers of high frequency signals because it is capable of low noise and high-speed operation. For example, in a BJT in which a base layer and an emitter layer are formed by epitaxial growth, by thinning the base layer to a thickness of 100 nm or less, the minimum noise figure can be reduced and high-speed operation can be exhibited in the gigahertz range.

In an npn BJT, Boron, for example, is introduced into the base layer as a p-type impurity. As the boron concentration in the base layer increases, the base resistance decreases to reduce the current gain. On the other hand, although the base resistance increases, the current gain is improved as the boron concentration decreases. Hence, the boron concentration in the base layer is optimized based on the use of the BJT.

In addition, SiGe, which is silicon (Si) compound containing Germanium (Ge), may be used for the base layer. By increasing the Ge concentration gradually from the emitter side to the collector side, an electric field direct from the collector to the emitter can be induced in the base layer. Thereby, the response speed of the BJT can be increased.

Thus, the BJT requires controlling the concentration of a p-type impurity introduced into the base layer accurately. Furthermore, since the electric field induced in the base layer depends on the concentration gradient of Ge, the control of the concentration profile of Ge is important. However, it is difficult to directly measure the concentration of a p-type impurity and the concentration profile of Ge in a base region of a microfabricated BJT. This creates a need for a method for measuring an impurity concentration profile that enables accurate control of the impurity concentration and the concentration profile of Ge in the base layer of the BJT and a method for manufacturing a semiconductor device using the measuring method, for example.

BRIEF DESCRIPTION OF THE DRAWINGS

FIG. 3A is a plan view illustrating an arrangement on a wafer, and FIGS. 3B and 3C are partial cross sectional views illustrating the wafer;

FIG. 4 is a graph of the impurity concentration profiles of two semiconductor layers each of which includes a measurement region having a different size;

DETAILED DESCRIPTION

Figure 1:
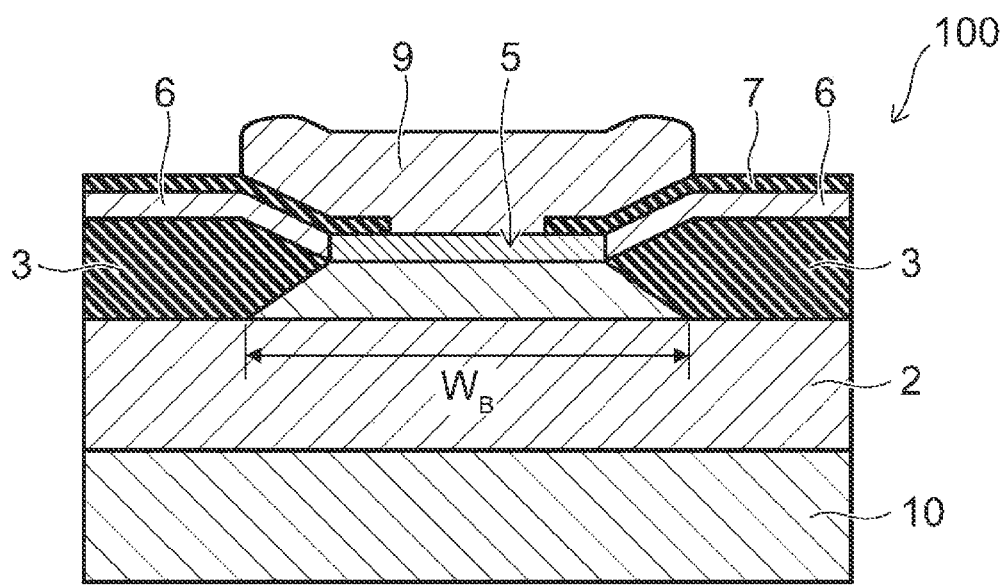
FIG. 1 is a schematic cross sectional view illustrating part of a cross section of a semiconductor device according to an embodiment.

In general, according to an embodiment, a method for measuring an impurity concentration profile uses a wafer including a semiconductor layer. The method includes measuring an impurity concentration profile in a depth direction from each surface of a plurality of first portions, each of the first portions being included in any one of a plurality of first regions provided in the semiconductor layer. Each of the first regions has a different size and is surrounded by a second region including a second portion having a different structure from the first portion. The method also includes determining a change between the impurity concentration profiles measured in the first regions.

Hereinbelow, embodiments of the invention are described with reference to the drawings. In the following embodiments, identical components in the drawings are marked with the same reference numerals, and a detailed description thereof is omitted as appropriate and different components are described.

FIG. 1 is a schematic view illustrating part of a cross section of a semiconductor device 100 according to an embodiment. The semiconductor device 100 is, for example, a BJT using SiGe as a p-type base layer 5.

As shown in FIG. 1, the semiconductor device 100 includes an n-type collector layer 2 provided on a silicon substrate 10, the p-type base layer 5 stacked on the n-type collector layer 2, and an n-type emitter layer 9.

The p-type base layer 5 contains SiGe and is provided directly on the n-type collector layer 2. The p-type base layer 5 is provided on the microfabricated layer of the n-type collector layer 2. For example, an STI (shallow trench isolation) 3 that defines a base region of the BJT is provided on the surface of the n-type collector layer 2. The width $W_B$ of the base region may be not more than 1 μm in the use for a low noise amplifier of the 2 GHz band, for example.

An interconnection layer 6 is formed on the STI 3 provided on the n-type collector layer 2. The STI 3 is a silicon oxide film ($SiO_2$), for example. The p-type base layer 5 and the interconnection layer 6 are simultaneously formed. However, for example, while the p-type base layer 5 formed on the n-type collector layer 2, which is an n-type silicon layer, becomes a single crystal, the interconnection layer 6 formed on the $SiO_2$ film of the STI 3 becomes polycrystal; thus, the crystal structure is different between the p-type base layer 5 and the interconnection layer 6.

A $SiO_2$ film 7 is provided on the surfaces of the p-type base layer 5 and the interconnection layer 6, and insulates the n-type emitter layer 9 from the interconnection layer 6. The $SiO_2$ film 7 includes an opening on the p-type base layer 5, and the p-type base layer 5 is in contact with the n-type emitter layer 9 via the opening.

Figure 2:
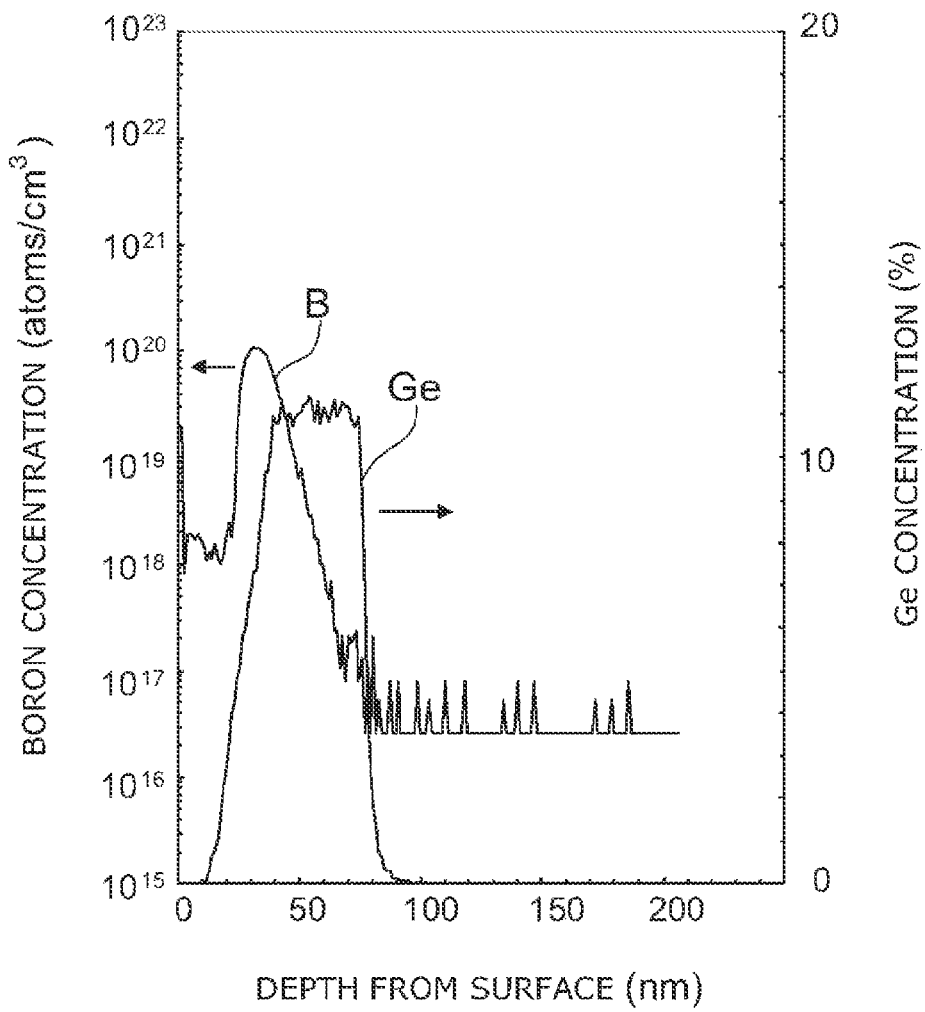
FIG. 2 is a graph of Boron (B) and Germanium (Ge) profiles in a semiconductor layer according to the embodiment.

FIG. 2 illustrates profiles of a p-type impurity (Boron) and Ge in the p-type base layer 5 of the semiconductor device 100. The vertical axis represents the concentrations of Boron and Ge, and the horizontal axis represents the depth from the surface of the p-type base layer 5. These concentration profiles were measured using the secondary ion mass spectroscopy (SIMS) method.

As shown in FIG. 2, the Boron profile has a peak at a depth of about 30 nm from the surface of the p-type base layer 5, and the peak value is about $1 \times 10^{20}$ cm$^{-3}$. On the other hand, in the Ge profile, it is found that the Ge concentration increases from the surface side of the p-type base layer to the collector side in a depth range from 10 nm to 40 nm and a SiGe layer containing about 11% of Ge is provided between 40 nm and 80 nm deep.

Next, a method for measuring an impurity concentration profile according to the embodiment is described with reference to FIG. 3 to FIG. 6. The impurity concentration profile in this specification includes not only profiles of an impurity/impurities introduced into a semiconductor layer but also profiles of an element/elements constituting the semiconductor layer.

FIGS. 3A to 3C are schematic views illustrating a wafer 20 according to the embodiment. FIG. 3A is a plan view illustrating an arrangement on the major surface of the wafer 20, and FIG. 3B and FIG. 3C are partial cross sections of the wafer.

The wafer 20 shown in FIG. 3A is an epitaxial wafer used for the fabrication of the semiconductor device 100. An element region 21 and a TEG (test element group) region 23 are provided in the major surface of the wafer 20.

In the element region 21, for example, a BJT is provided including the n-type collector layer 2, the p-type base layer 5, and the n-type emitter layer 9. On the other hand, a plurality of test patterns are formed in the TEG region 23. A measurement region for measuring an impurity concentration profile may be further provided in the TEG region 23.

FIG. 3B and FIG. 3C schematically illustrate cross sections of measurement regions provided in the TEG regions 23. For example, a semiconductor layer 12 is provided on the surface of the silicon substrate 10, and an STI 14 is provided on the surface of the semiconductor layer 12. A semiconductor layer 17 is provided on the semiconductor layer 12 and the STI 14. The semiconductor layer 12 is an epitaxial layer formed simultaneously with the n-type collector layer 2, and the STI 14 is formed simultaneously with the STI 3 provided in the element region 21. The semiconductor layer 17 is an epitaxial layer formed simultaneously with the p-type base layer 5 and the interconnection layer 6.

A measurement region 17a for measuring an impurity concentration profile shown in FIG. 3B may be a square with a side width of $W_1$, for example. A second region 17c is formed to surround the measurement region 17a, which is a first region. A first portion formed in the measurement region 17a and a second portion formed in the second region 17c are parts of the semiconductor layer 17 and are different in structure from each other.

That is, in the semiconductor layer 17, the first portion formed in the measurement region 17a corresponds to the p-type base layer 5 shown in FIG. 1, and the second portion formed in the region 17c surrounding the measurement region 17a corresponds to the interconnection layer 6. By setting the width $W_1$ of the measurement region 17a to a size allowing the measurement of the impurity concentration profile, it becomes possible to monitor the impurity concentration profile in the p-type base layer 5 of the BJT formed in the element region 21.

Further, as shown in FIG. 3C, in the method for measuring an impurity concentration profile according to the embodiment, a measurement region 17b may be provided in another TEG region 23 with a different size from the measurement region 17a. For example, the measurement region 17b may be a square with a side width of $W_2$ and provided so as to satisfy $W_2 < W_1$.

The SIMS method, for example, is used for measuring the impurity concentration profile. By the SIMS method, the impurity profile can be measured relatively easily in the depth direction from the surface of the semiconductor layer. The measurement by the SIMS method is performed, for example, in a rectangular shape area with a side length of 100 μm or more. (That is, the measurement region is set larger than the irradiation area of an ion beam used for the SIMS method.) It is difficult to directly measure by the SIMS method in the base region of the microfabricated BJT. In this regard, the width $W_1$ of the measurement region 17a and the width $W_2$ of the measurement region 17b may be set to 100 μm or more, for example. Thereby, the impurity concentration profile in the p-type base layer 5 can be monitored in the measurement regions using the SIMS method.

Furthermore, not limited to the example mentioned above, it is also possible to use a monitoring wafer for measuring the impurity concentration profile in the p-type base layer 5. For example, using an epitaxial growth apparatus capable of processing a plurality of wafers simultaneously, semiconductor layers including the p-type base layer 5 can be simultaneously grown on both the wafer for fabricating the semiconductor device 100 and the wafer for monitoring the impurity concentration profile.

Furthermore, by providing at least two measurement regions with different sizes in TEG regions 23 or the monitoring wafer, the change between the impurity concentration profiles can be monitored depending on the area of the measurement region (i.e., the first portion of the semiconductor layer 17). Furthermore, three or more regions with different sizes may be provided to allow highly accurate monitoring even in the case where the impurity concentration profile does not change linearly depending on the area of the measurement region.

Hereinbelow, the concentration profiles of Boron and Ge measured in the measurement region 17a or the monitoring wafer are referred to as those in the p-type base layer 5, for the sake of convenience.

FIG. 4 shows the Boron concentration profiles of measurement examples A and B. Similarly to FIG. 2, the horizontal axis represents the depth from the surface of the p-type base layer 5, and the vertical axis represents the Boron concentration. The concentration profiles denoted by A are the ones measured using a monitoring wafer in which the same epitaxial layer as the p-type base layer 5 is formed uniformly on the entire surface of a substrate. On the other hand, the concentration profiles denoted by B are the ones measured in a measurement region with a side length of 200 μm.

The concentration profiles denoted by B are lower than the concentration profiles denoted by A. That is, this shows that the Boron concentration is lower in the p-type base layer 5 formed in a limited region with a side length of 200 μm than in the p-type base layer 5 having grown on the entire substrate surface.

Figure 5:
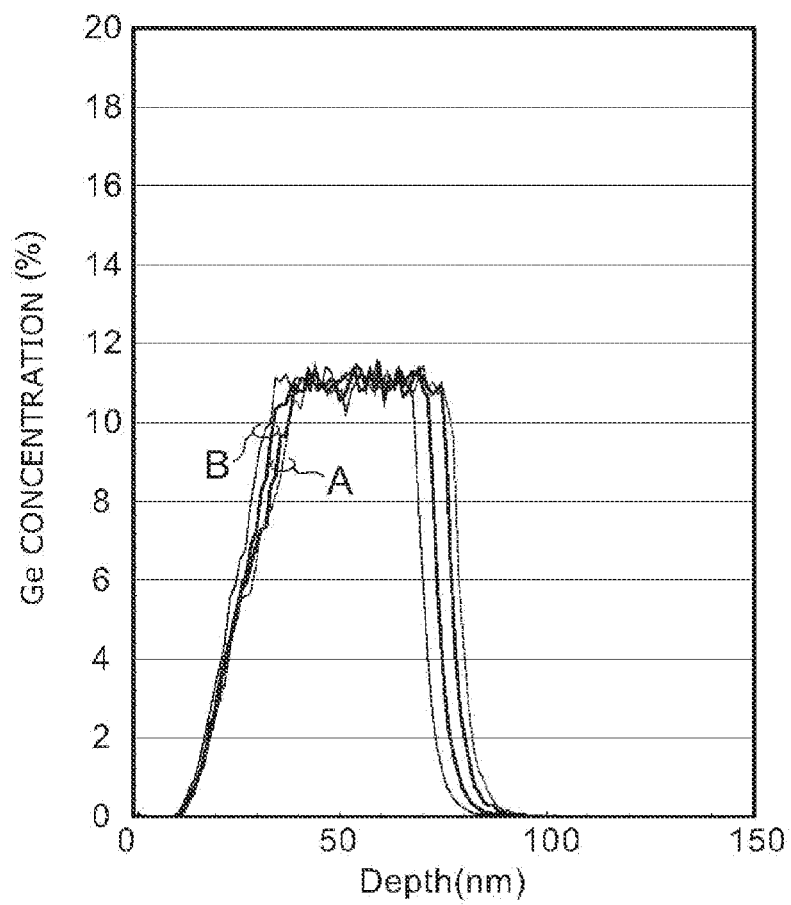
FIG. 5 is a graph of Ge concentration profiles in measurement regions each of which has a different size.

FIG. 5 shows the concentration profiles of Ge in the p-type base layer 5. The horizontal axis represents the depth from the surface of the p-type base layer 5, and the vertical axis represents the Ge concentration. Similarly to FIG. 4, the concentration profiles denoted by A are the ones in an epitaxial layer formed on the entire surface of a substrate, and the concentration profiles denoted by B are the ones measured in a measurement region with a side length of 200 μm.

It is found in FIG. 5 that the gradient of the Ge concentration profiles in the surface side of the p-type base layer 5 is different between the measurement examples A and B. More specifically, it is shown that the gradient of the Ge concentration is steeper in the p-type base layer 5 formed in a limited region with a side length of 200 μm than that in the p-type base layer 5 grown on the entire substrate surface. Even a slight gradient difference between the measurement example A and the measurement example B shown in FIG. 5 may change the strength of the electric field induced in the p-type base layer 5 and affect the response speed of the BJT.

As mentioned above, it is found in FIG. 4 and FIG. 5, that the impurity concentration profile is different between the p-type base layer 5 formed on the entire large substrate surface and the p-type base layer 5 formed in a limited region with a width of 200 μm.

Figure 6:
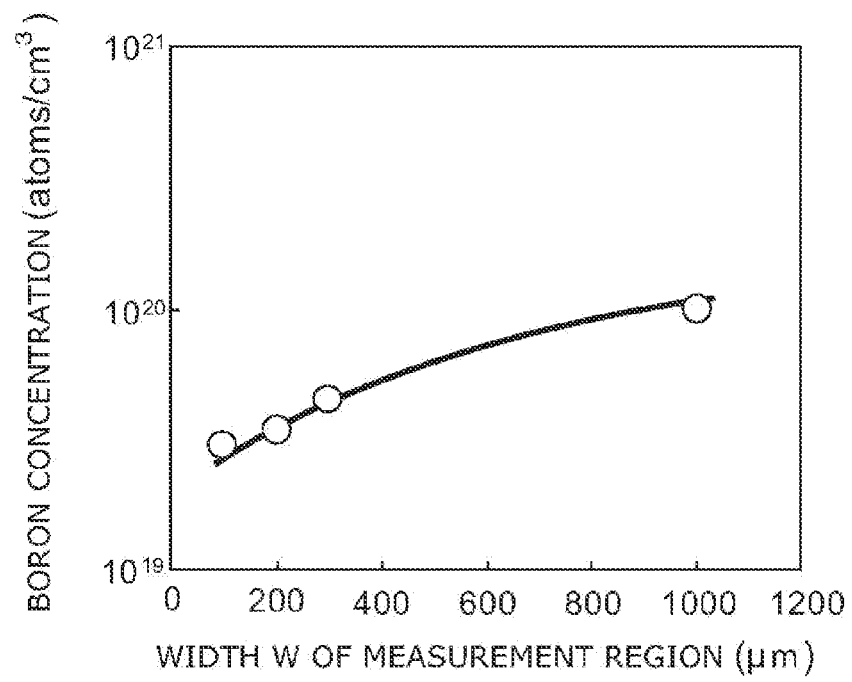
FIG. 6 is a graph showing the impurity concentration in the semiconductor layer to the size of the measurement region.

FIG. 6 is a graph showing the peak concentration of Boron in the p-type base layer 5 to the size of the measurement region. As shown in the drawing, it is found that the B concentration in the p-type base layer 5 decreases as the width W of the measurement region (i.e., the first portion of the semiconductor layer 17) narrows. Then, the Boron concentration in the p-type base layer 5 formed in the microfabricated BJT in the element region 21 can be estimated by extrapolating a line fitting to the points plotted in the drawing to a region near W=0.

For example, in the graph shown in FIG. 6, the peak concentration of Boron in an actual BJT is estimated to be 2 to $3 \times 10^{19}$ cm$^{-3}$. In contrast, the peak concentration of Boron monitored in such a large measurement region with a width W of 1000 μm or more is about $1 \times 10^{20}$ cm$^{-3}$, and there is a great difference.

Such a phenomenon in which the Boron concentration changes depending on the area of the p-type base layer 5 is referred to as the loading effect in the epitaxial growth, which is considered to result from a difference between the amount of Boron incorporated in the p-type base layer 5 and that incorporated in a region therearound.

The p-type base layer 5 is a single-crystal layer formed on the n-type collector layer 2. On the other hand, the interconnection layer 6 therearound is a polycrystal layer formed on the STI 3. The amount of Boron incorporated in a polycrystal layer is larger than that incorporated in a single-crystal layer. Hence, it is considered that, in epitaxial growth where supply rates of materials determine a chemical reaction, the amount of Boron incorporated in the p-type base layer 5 changes depending on the area of the p-type base layer 5 and the loading effect mentioned above is caused. Also the change in the gradient of the Ge concentration in the concentration profile of Ge described above can be perceived as the loading effect similarly.

As mentioned above, the loading effect depending on the area of the measurement region (i.e., the first portion of the semiconductor layer 17) can be determined by using the method for measuring an impurity concentration profile according to the embodiment. Furthermore, the epitaxial growth control becomes possible on the basis of the loading effect determined and may improve the manufacturing yield of the semiconductor device 100.

Next, a method for manufacturing the semiconductor device 100 is described with reference to FIG. 7 to FIG. 10, including the step for measuring an impurity concentration profile according to the embodiment.

Figure 7:
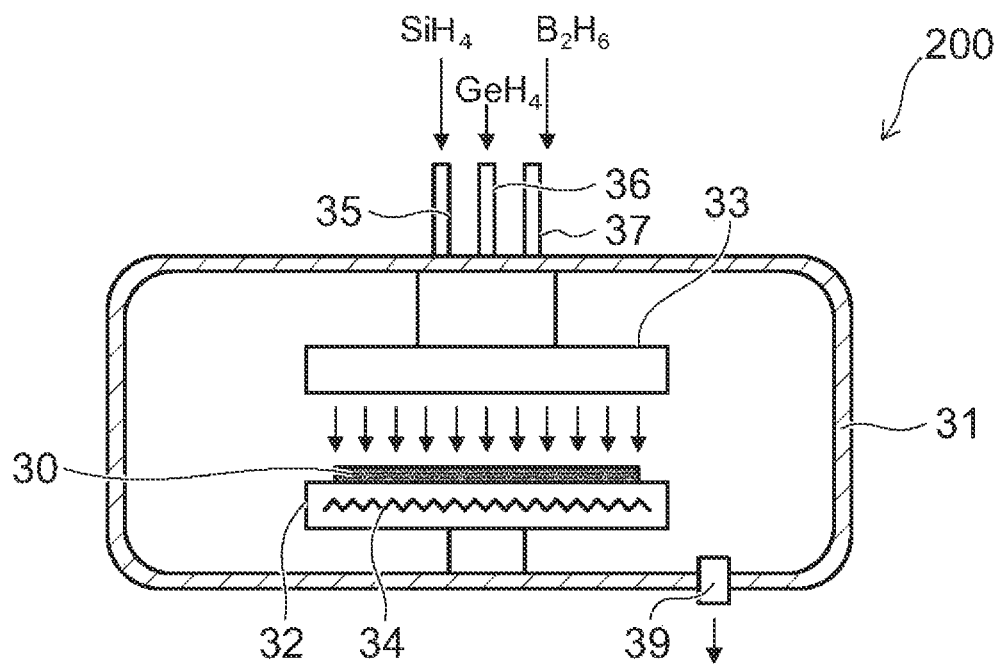
FIG. 7 is a schematic cross-sectional view illustrating an epitaxial growth apparatus.

FIG. 7 is a schematic cross-sectional view illustrating an epitaxial growth apparatus 200 according to the embodiment. The epitaxial growth apparatus 200 is, for example, a low-pressure CVD (chemical vapor deposition) apparatus, which includes, in a reaction chamber 31, a susceptor 32 for mounting a growth substrate 30 and a shower head 33 for supplying source materials.

The growth substrate 30 is heated by a heater 34 mounted on the susceptor 32, and is kept at a growth temperature. Monosilane ($SiH_4$) and germane ($GeH_4$), which are the source materials of a semiconductor layer, and a doping material ($B_2H_6$) of a p-type impurity are supplied in the gas phase from the shower head 33 facing to the susceptor 32 and a semiconductor layer is epitaxially grown on the surface of the growth substrate 30.

$SiH_4$, $GeH_4$, and $B_2H_6$ are supplied to the shower head 33 via gas tubes 35 to 37 and discharged toward the growth substrate 30 from a plurality of pin holes provided at the face opposite to the susceptor 32. On the other hand, the interior of the reaction chamber 31 is connected to a vacuum exhaust system (not-shown) via an exhaust port 39, and the pressure can thereby be kept constant in the reaction chamber 31.

In the epitaxial growth apparatus 200 mentioned above, for example, the growth temperature, the supply amount of source materials, and the pressure in the reaction chamber are set as growth conditions capable for forming a prescribed semiconductor layer. In the case where the wafer 20 is fabricated for the semiconductor device 100, these conditions are determined to be adapt to the specifications of the semiconductor device 100, and the epitaxial growth of each semiconductor layer is carried out under the conditions. Then, as described later, the test result of the epitaxially grown layer may be fed back to modify the each growth condition and, for example, the gradients of the Boron concentration and the Ge concentration in the p-type base layer 5 can be maintained in a desired range.

Figure 8:
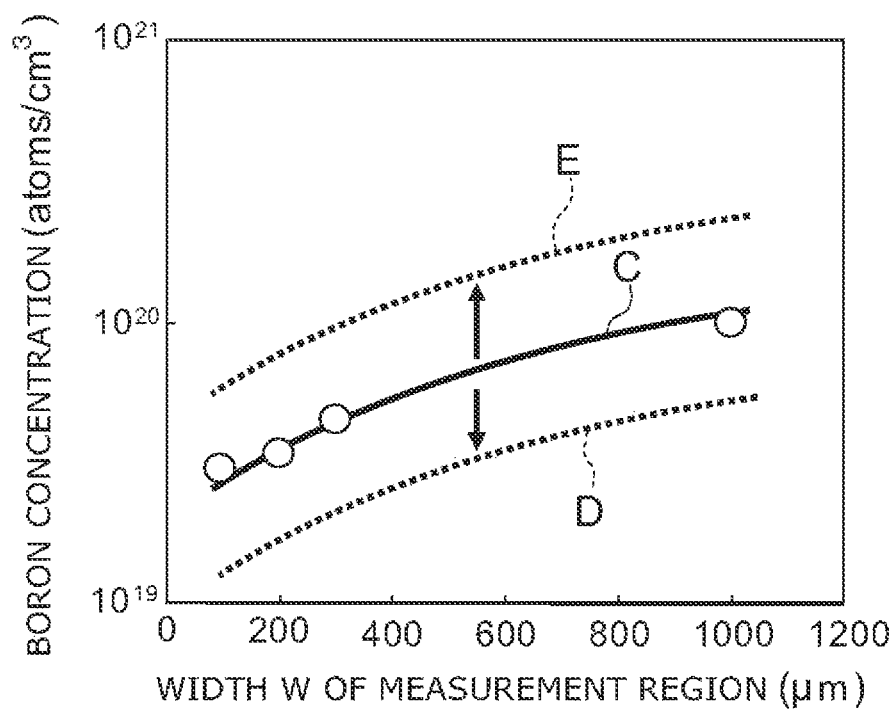
FIG. 8 is a graph illustrating changes in the impurity concentration data.

FIG. 8 is a graph illustrating changes in the measurement data of the B concentration in the p-type base layer 5. Similarly to FIG. 6, the horizontal axis represents the width W of the measurement region, and the vertical axis represents the peak concentration of Boron introduced into the p-type base layer 5.

As shown in FIG. 8, there is a case where, for example, the initial characteristics C of the epitaxial growth apparatus 200, i.e. the loading effect of the Boron concentration depending on the width W of the measurement region, changes as epitaxial growth is repeated and is parallel shifted to the state D or E shown in the drawing. In the case shown in FIG. 8, the change in the Boron concentration in the p-type base layer 5 of the microfabricated BJT can be detected by monitoring the Boron concentration using one of the measurement regions or the monitoring wafer in which the p-type base layer 5 is formed on the entire surface of a substrate. The initial state C can be restored by, for example, controlling the supply amount of the doping material $B_2H_6$. In many cases where the loading effect is not considered, the control of an epitaxial growth apparatus is carried out on the assumption that such a change shown in FIG. 8 takes place.

Figure 9:
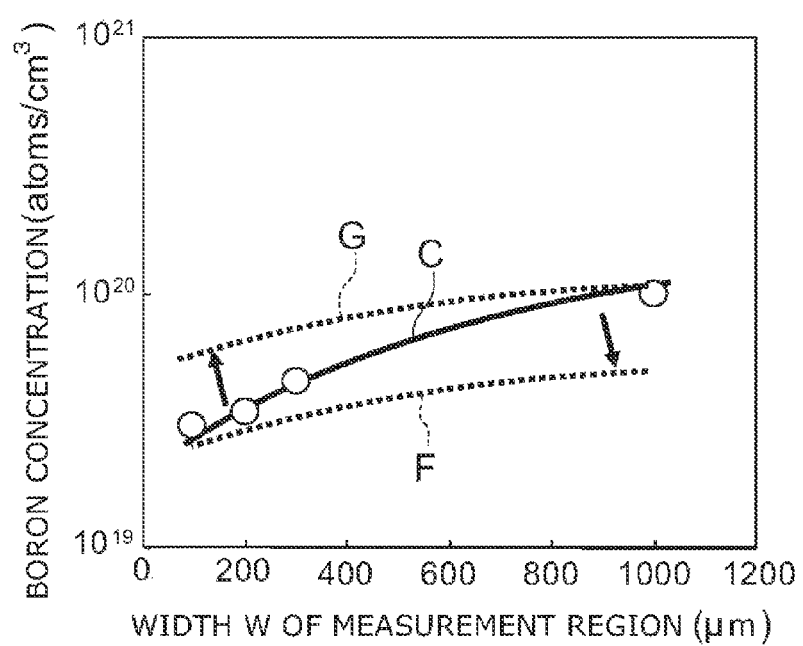
FIG. 9 is a graph illustrating other changes in the impurity concentration data.

However, the change in the Boron concentration as shown in FIG. 8 does not necessarily take place every time. For example, FIG. 9 is a graph illustrating other changes in the Boron concentration depending on the width W of the measurement region. There is a case where the gradient of the Boron concentration to the width W changes and the initial characteristics C is shifted to the state G or F as shown in FIG. 9. With respect to such a change in the loading effect, it is difficult to detect the concentration change in the p-type base layer 5 of the microfabricated BJT by monitoring the Boron concentration using one of the measurement regions or the monitoring wafer in which the p-type base layer 5 is formed on the entire substrate surface.

For example, in the case where the Boron concentration in the p-type base layer 5 is monitored using a measurement region with a width W of 1000 μm or more or the monitoring wafer in which the p-type base layer 5 is formed on the entire substrate surface, if the characteristics of the epitaxial growth apparatus 200 change from C to F, a change takes places in the monitored concentration, although the Boron concentration in the p-type base layer 5 of the BJT does not change. On the other hand, in the case where the state shifts from C to G, no change takes place in the monitored concentration, although the Boron concentration changes in the p-type base layer 5 of the BJT.

Therefore, in the case where the change in the loading effect of the epitaxial growth apparatus 200 has taken place as shown in FIG. 9, the Boron concentration in the p-type base layer 5 of the BJT becomes impossible to be controlled with the method of monitoring the Boron concentration using one of measurement regions or the monitoring wafer in which the p-type base layer 5 is formed on the entire substrate surface, and the manufacturing yield of the semiconductor device 100 is reduced.

In contrast, in the method for measuring an impurity concentration profile according to the embodiment, the Boron concentrations may be monitored in a plurality of measurement regions (i.e., first portions of the semiconductor layer 17) with different sizes; thereby, the change of the Boron concentration depending on the area can be determined, i.e. the loading effect can be monitored. Thus, the manufacturing yield can be improved by introducing the method according to the embodiment into the manufacturing processes of the semiconductor device 100.

Figure 10:
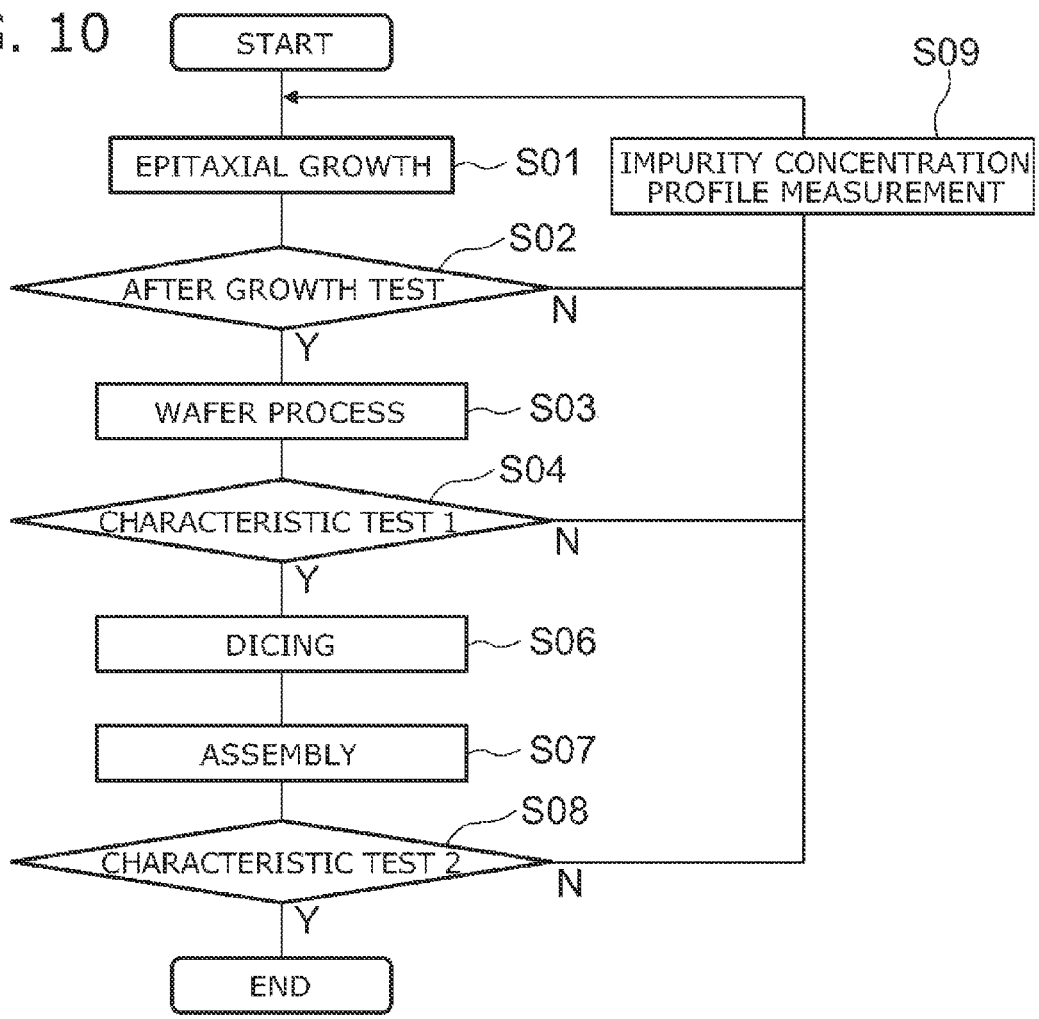
FIG. 10 is a flow diagram showing manufacturing processes of the semiconductor device according to the embodiment.

Next, a method for manufacturing the semiconductor device 100 according to this embodiment is described with reference to FIG. 10. The drawing illustrates a control flow for the epitaxial growth apparatus 200 in the manufacturing processes of the semiconductor device 100.

In an epitaxial growth process (S01), for example, the n-type collector layer 2 is grow on the p-type silicon substrate 10, and the p-type base layer 5 is grow on the n-type collector layer 2 in which the STI 3 is formed.

The initial state C of the loading effect in the epitaxial growth apparatus 200 is found beforehand. For example, the growth conditions of the epitaxial growth apparatus 200 may be set to conform to the initial state C which is known as the loading effect of an existing epitaxial growth apparatus. This facilitates setting growth conditions for each epitaxial layer. Specifically, the method for measuring an impurity concentration profile according to the embodiment is used to make an investigation of the epitaxial layer; and based on the result of the investigation, for example, the pressure in the reaction chamber 31 and the temperature of the susceptor 32 during the epitaxial growth are adjusted to conform with the loading effect of the existing growth apparatus. Thereby, the growth conditions are determined to duplicate the same initial state C in the epitaxial growth apparatus 200.

Next, the supply amount of source material is adjusted to control the growth rate of the epitaxial layer, and the supply rate of the doping material is adjusted to set the impurity concentration in the epitaxial layer.

The growth conditions for the epitaxial growth apparatus 200 are determined through the procedure mentioned above, and the manufacturing of the semiconductor device 100 can be started.

The epitaxially grown wafer undergoes an wafer test after the epitaxial growth (S02).

For example, the surface state, the presence or absence of a crystal defect, and the like are examined in the wafer 20 used for fabricating the semiconductor device 100. At the same time, for example, a monitoring wafer is examined to measure the impurity concentration in the p-type base layer 5. C-V (capacitance-voltage) measuring method or the like, for example, may be used for measuring the impurity concentration.

In the case where results obtained show that the impurity concentration in the p-type base layer 5 deviates from a control range, the epitaxial growth apparatus 200 is determined as in out of normal condition (N), and the method according to the embodiment is carried out for measuring the impurity concentration profiles (S09). In this case, as described above, the measurement may be carried out using the wafer 20 provided with TEG regions, which includes a plurality of measurement regions with different widths W. Furthermore, the monitoring wafer may be also used in which a plurality of measurement regions are provided with different widths W. Thereby, the loading effect of the epitaxial growth apparatus 200 is found. If the result shows a change from the initial state C, for example, the pressure in the reaction chamber 31 and the temperature of the susceptor 32 are adjusted to determine growth conditions for restoring the initial state C.

Furthermore, the impurity concentration profile measurement (S09) may be carried out based on the result of a characteristic test 1 (S04) after wafer process (S03).

In the wafer processing (S03), a prescribed pattern is provided in the TEG region, and various characteristics can be measured in a subsequent test (S04). For example, a resistance can be measured in the p-type base layer 5. In the case where the resistance value of the p-type base layer 5 deviates from a prescribed control range, the epitaxial growth apparatus 200 may be determined as in out of normal condition (N) to make the measurement of the impurity concentration profile (S09).

The impurity concentration profile measurement (S09) may be also carried out based on the result of a characteristic test 2 (S08), where the semiconductor device 100 is finally examined after dicing into a chip (S06) and an assembly process (S07).

In the characteristic test 2 (S08), various characteristics are examined for the semiconductor device 100. It is also possible for monitoring the state of the epitaxial growth apparatus 200 to set a control range for the characteristics related to the crystal composition or the impurity concentration in the epitaxial layer. For example, the frequency response characteristic of the BJT may be used to monitor the change in the gradient of the Ge concentration in the p-type base layer 5. For example, if the frequency response characteristic deviates from the control range, the epitaxial growth apparatus 200 may be determined as out of normal condition (N) to make a measurement of the Ge concentration profile, and the growth conditions may be adjusted based on the loading effect.

As mentioned above, the method for measuring an impurity concentration profile according to this embodiment can be performed in the manufacturing processes for the semiconductor device 100. By carrying out the control of the loading effect of the epitaxial growth apparatus 200, it becomes possible to accurately control the concentration of the p-type impurity Boron and the gradients of the Ge concentration in the p-type base layer 5 and to improve the manufacturing yield.

Although the BJT containing SiGe in the base layer is described as an example in this embodiment, this embodiment can be applied to other semiconductor devices including an epitaxial layer. Furthermore, the configuration of the measurement region is not limited to a square, but any configuration is possible to the extent that, for example, the minimum width W of the region is not less than a width capable of the measurement using the SIMS method. Moreover, the impurity concentration profile described in the embodiments mentioned above includes, for example, profiles of elements constituting a compound semiconductor.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A wafer, comprising:
   a substrate;
   a plurality of measurement regions provided on the substrate, each measurement region surrounded by an isolation element and having a different size; and
   a semiconductor layer provided on the substrate and the isolation element and including a first portion on the substrate and a second portion on the isolation element, wherein an impurity concentration profile of the first portion is measured at the measurement regions.

2. The wafer according to claim 1, wherein the substrate includes at least three of the measurement regions with different sizes.

3. The wafer according to claim 1, wherein the first portion of the semiconductor layer has a different structure from the second portion of the semiconductor layer.

4. The wafer according to claim 3, wherein the first portion includes a single crystal and the second portion includes a polycrystal.

5. The wafer according to claim 1, wherein the substrate includes an element region and a plurality of test element group regions and each measurement region is included in one of the test element group regions.

6. The wafer according to claim 1, wherein the semiconductor layer contains silicon and germanium.

7. The wafer according to claim 1, wherein each measurement region is rectangular.

8. The wafer according to claim 1, wherein each measurement region has a width that is greater than one hundred microns.

* * * * *